US012740355B2

(12) United States Patent
Pavlopoulos et al.

(10) Patent No.: US 12,740,355 B2
(45) Date of Patent: Sep. 15, 2026

(54) BOTTOM THICK OXIDATION GROWTH IN HIGH ASPECT RATIO FEATURES

(71) Applicant: Applied Materials, Inc., Santa Clara, CA (US)

(72) Inventors: Dimitrios Pavlopoulos, Glendale, CA (US); Hansel Lo, San Jose, CA (US); Christopher S. Olsen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 759 days.

(21) Appl. No.: 18/153,709

(22) Filed: Jan. 12, 2023

(65) Prior Publication Data

US 2024/0242962 A1 Jul. 18, 2024

(51) Int. Cl.

*H10P 14/692* (2026.01)
*H10P 14/60* (2026.01)
*H10P 50/28* (2026.01)

(52) U.S. Cl.

CPC .... *H10P 14/69215* (2026.01); *H10P 14/6308* (2026.01); *H10P 14/6322* (2026.01); *H10P 14/6339* (2026.01); *H10P 14/69391* (2026.01); *H10P 50/283* (2026.01)

(58) Field of Classification Search

CPC ......... H01L 21/02164; H01L 21/02178; H01L 21/02236; H01L 21/02255; H01L 21/0228; H01L 21/31111; H01L 21/02238; H01L 21/32; H10P 14/69215; H10P 14/6308; H10P 14/6322; H10P 14/6339; H10P 14/69391; H10P 50/283; H10P 14/61; H10P 14/6309

See application file for complete search history.

(56) References Cited

U.S. PATENT DOCUMENTS

| | | | |
|---|---|---|---|
| 5,693,562 | A | 12/1997 | Tseng |
| 6,924,226 | B2 | 8/2005 | Cohen |
| 7,171,973 | B2 | 2/2007 | Orii et al. |
| 7,592,254 | B2 | 9/2009 | Abelson et al. |
| 7,780,865 | B2 | 8/2010 | Balseanu et al. |

(Continued)

FOREIGN PATENT DOCUMENTS

| | | |
|---|---|---|
| JP | H05121535 A | 5/1993 |
| JP | H10261641 A | 9/1998 |

(Continued)

OTHER PUBLICATIONS

Intenational Search Report and Written Opinion in related application PCT/US2024/010995 dated May 13, 2024.

(Continued)

*Primary Examiner* — Julia Slutsker

(74) *Attorney, Agent, or Firm* — Patterson + Sheridan, LLP

(57) ABSTRACT

The present disclosure generally relate to semiconductor device fabrication, and more particularly, to methods of forming a bottom thick oxide layer in a high aspect ratio semiconductor structures. In certain embodiments, the method includes depositing a non-conformal oxide layer on in a feature on a substrate, performing an oxidation process to thermally grow an oxide layer beneath the deposited non-conformal oxide layer in the feature, and selectively stripping the non-conformal oxide layer to expose the thermally grown oxide layer.

20 Claims, 11 Drawing Sheets

(56) References Cited

U.S. PATENT DOCUMENTS

| | | | |
|---|---|---|---|
| 7,964,042 | B2 | 6/2011 | Kojimaru et al. |
| 9,478,495 | B1 | 10/2016 | Pachamuthu et al. |
| 9,853,122 | B2 | 12/2017 | Yoshinari |
| 10,766,054 | B2 | 9/2020 | Kanematsu |
| 10,847,413 | B2 | 11/2020 | Khaderbad et al. |
| 11,152,204 | B2 | 10/2021 | Nakai et al. |
| 11,404,432 | B2 | 8/2022 | Byeon et al. |
| 2007/0141779 | A1 | 6/2007 | Abelson et al. |
| 2009/0093100 | A1 | 4/2009 | Xia et al. |
| 2014/0073128 | A1 | 3/2014 | Jong |
| 2014/0084343 | A1 | 3/2014 | Dewey et al. |
| 2014/0273498 | A1 | 9/2014 | Kobayashi et al. |
| 2016/0233105 | A1 | 8/2016 | Li |
| 2016/0343657 | A1 | 11/2016 | Sawa et al. |
| 2020/0312841 | A1 | 10/2020 | Rachmady et al. |
| 2020/0381246 | A1* | 12/2020 | Nakai ............... H01L 21/68764 |
| 2021/0028187 | A1* | 1/2021 | Byeon ............... H01L 21/02315 |
| 2021/0074704 | A1 | 3/2021 | Lilak et al. |

FOREIGN PATENT DOCUMENTS

| | | | |
|---|---|---|---|
| KR | 2017-0034160 | A | 3/2017 |
| KR | 10-2021-0012786 | A | 2/2021 |
| WO | 2020154123 | A1 | 7/2020 |

OTHER PUBLICATIONS

Office Action from South Korean Patent Application No. 10-2025-7026433 dated Jan. 16, 2026.

Office Action from Japanese Patent Application No. 2025-540861 dated May 12, 2026.

* cited by examiner 400
416
406
416
412
412
414
411
408
404
400

BOTTOM THICK OXIDATION GROWTH IN HIGH ASPECT RATIO FEATURES

BACKGROUND

Field

Embodiments of the present disclosure generally relate to semiconductor device fabrication, and more particularly, to methods of forming a bottom thick oxide layer in a high aspect ratio semiconductor structures.

Description of the Related Art

The production of silicon integrated circuits has placed difficult demands on fabrication processes to increase the number of devices while decreasing the minimum feature sizes on a chip. These demands have extended to fabrication processes including depositing layers onto difficult topologies while maintaining device reliability. As the number of vertically stacked memory cells in 3D NAND devices increases (e.g., as chip densities increase), the aspect ratio of memory cell strings also increases, introducing numerous manufacturing issues. For example, it is desirable to form oxidation layers with greater thicknesses near the bottom of the high aspect ratio feature to assist in compensating for some of the common integration issues in processes for 3D NAND devices having high aspect ratio features.

Conventional methods of growing an oxide layer in such high aspect ratio structures suffer from one or both of two issues. The first issue is rapid and uneven oxygen radical consumption and depletion during thermal oxidation growth in high aspect ratio fears. That is, oxide layers grown in high aspect ratio structures are commonly top thick due to oxidant flow and consumption immediately starting from the top of the feature thereby causing depletion before the oxidant has a chance to flow and reach the bottom of the feature. The second issue is low quality of a formed oxide layer by deposition, which may include defects and traps within, thus leading to reduced device reliability.

Since grown oxide layers are known to be of better quality than any deposited oxide layer, there is a need for improved processes for grow a bottom thick oxide layer in high aspect ratio features.

SUMMARY

Embodiments of the present disclosure generally relate to semiconductor device fabrication, and more particularly, to methods of forming a bottom thick oxide layer in a high aspect ratio semiconductor structures. In some embodiments, a method is provided for forming an oxide layer suitable for use in semiconductor manufacturing. The method includes forming a non-conformal oxide layer on a substrate, performing an oxidation process to oxidize the substrate and grow a thermal oxide layer underneath the non-conformal oxide layer, and selectively removing the non-conformal oxide layer to expose an oxidized portion of the substrate.

In other embodiments, a method is provided for forming an oxide layer suitable for use in semiconductor manufacturing. The method includes forming a non-conformal aluminum oxide layer on a substrate, performing an oxidation process to oxide the substrate and grow a thermal oxide layer underneath the non-conformal aluminum oxide layer, and selectively removing the aluminum oxide layer to expose an oxidized portion of the substrate.

In further embodiments, a method is provided for forming an oxide layer suitable for use in semiconductor manufacturing. The method includes forming a non-conformal aluminum oxide layer on a silicon containing substrate using a tunable deposition process, performing an oxidation process to oxidize the silicon containing substrate and grow a thermal oxide layer underneath the non-conformal aluminum oxide layer, and performing a wet etching process to selectively remove the non-conformal aluminum oxide layer and expose an oxidized portion of the silicon containing substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to apparatus and methods to form bottom thick oxide layers in high aspect ratio features on a substrate. Certain details are set forth in the following description and figures to provide a thorough understanding of various implementations of the disclosure. Other details describing well-known methods and systems often associated with the deposition of thin films are not set forth in the following disclosure to avoid unnecessarily obscuring the description of the various implementations.

Many of the details, components and other features described herein are merely illustrative of particular implementations. Accordingly, other implementations can have other details, components, and features without departing from the spirit or scope of the present disclosure. In addition, further implementations of the disclosure can be practiced without several of the details described below.

Other deposition chambers may also benefit from the present disclosure and the parameters disclosed herein may vary according to the particular deposition chamber used to form the oxide layers described herein. For example, other deposition chambers may have a larger or smaller volume, requiring gas flow rates that are larger or smaller than those recited for deposition chambers available from Applied Materials, Inc.

Implementations of the present disclosure provide for forming bottom thick oxidation layers in high aspect ratio (HAR) features, such as 3D NAND pillars, with no impact on thermal budget. For oxidation processes performed to convert and grow an oxidation layer on a substrate, oxidants must diffuse through existing oxide layers on the substrate in order to react with and oxide the atoms of the substrate. Such existing oxide layers on the substrate may function as a retarding layer and slow down the oxidation rate of substrate atoms adjacent to the oxide layer to be traversed by the oxidants. For example, it was observed that by increasing the thickness of the oxide layer on the substrate, the oxidation rate of the atoms of the substrate adjacent to the traversed oxide layer slows due to the increased distance that must be traversed by the oxidants. Accordingly, by increasing the distance near the top of HAR features needing to be diffused through by oxidants for oxidizing the substrate, such as by having a thicker oxide layer on the surface of the sidewall near the top of the HAR feature as compared to the bottom of the HAR feature, the oxidation rate at the top of the HAR feature can be slowed to enable bottom thick oxidation layers to be grown in the HAR feature. It was also found that by also increasing the thickness of the oxide layer near the bottom of the HAR feature, a catalytic effect was observed in that the oxidation rate at the bottom of the HAR feature further increased leading to an even thicker oxidation layer being grown near the bottom of the HAR feature as would have otherwise been formed.

Figure 1A:
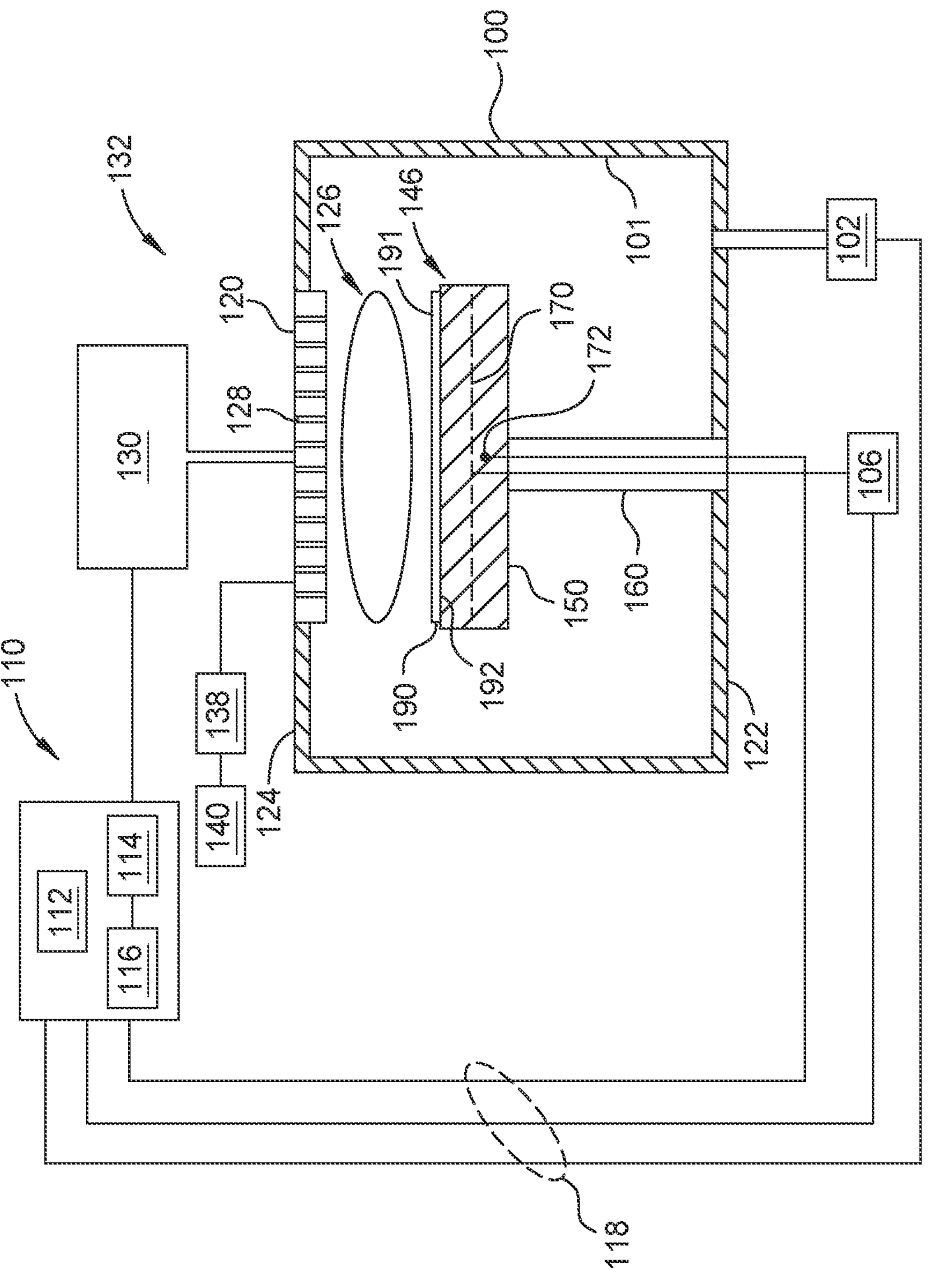
FIG. 1A shows a schematic illustration of an example process chamber that can be used for the practice of the method depicted in FIG. 3, according to certain embodiments of the present disclosure.

FIG. 1A is a schematic side cross sectional view of an example processing system 132 suitable for conducting a deposition process according to at least one embodiment disclosed here. Suitable chambers may be obtained from Applied Materials, Inc. located in Santa Clara, Calif. It is to be understood that the system described below is an exemplary process chamber and other chambers, including chambers from other manufacturers, may be used with or modified to accomplish embodiments of the present disclosure (e.g., method 300 described below). In some embodiments, the processing system 132 may be configured to deposit non-conformal films onto a substrate using an atomic layer deposition (plasma enhanced and/or thermal) process.

The processing system 132 includes a process chamber 100 coupled to a gas panel 130 and a controller 110. The process chamber 100 generally includes a top wall 124, a sidewall 101 and a bottom wall 122 that define a processing volume 126. A substrate support assembly 146 is provided in the processing volume 126 of the process chamber 100. The substrate support assembly 146 generally includes an electrostatic chuck 150 supported by a stem 160. The electrostatic chuck 150 may be typically fabricated from aluminum, ceramic, and other suitable materials. The electrostatic chuck 150 may be moved in a vertical direction inside the process chamber 100 using a displacement mechanism (not shown).

A vacuum pump 102 is coupled to a port formed in the bottom of the process chamber 100. The vacuum pump 102 is used to maintain a desired gas pressure in the process chamber 100. The vacuum pump 102 also evacuates post-processing gases and by-products of the process from the process chamber 100.

The substrate processing system 132 may further include additional equipment for controlling the chamber pressure, for example, valves (e.g., throttle valves and isolation valves) positioned between the process chamber 100 and the vacuum pump 102 to control the chamber pressure.

A gas distribution assembly 120 having a plurality of apertures 128 is disposed on the top of the process chamber 100 above the electrostatic chuck 150. The apertures 128 of the gas distribution assembly 120 are utilized to introduce process or precursor gases into the process chamber 100. The apertures 128 may have different sizes, number, distributions, shape, design, and diameters to facilitate the flow of the various process gases for different process requirements. The gas distribution assembly 120 is connected to the gas panel 130 that allows various gases to supply to the processing volume 126 during processing. A plasma is formed from the process gas mixture exiting the gas distribution assembly 120 to enhance thermal decomposition of the process gases resulting in the deposition of material on a surface 191 of the substrate 190.

The gas distribution assembly 120 and the electrostatic chuck 150 may form a pair of spaced apart electrodes in the processing volume 126. One or more RF power source 140 provide a bias potential through a matching network 138, which is optional, to the gas distribution assembly 120 to facilitate generation of plasma between the gas distribution assembly 120 and the electrostatic chuck 150. Alternatively, the RF power source 140 and the matching network 138 may be coupled to the gas distribution assembly 120, the electrostatic chuck 150, or coupled to both the gas distribution assembly 120 and the electrostatic chuck 150, or coupled to an antenna (not shown) disposed exterior to the process chamber 100. In some implementations, the RF power source 140 may produce power at a frequency of 350 KHz, 2 MHz, 13.56 MHz, 27 MHz, 40 MHz, 60 MHz, or 100 MHz. In one implementation, the RF power source 140 may provide between about 100 Watts and about 3,000 Watts at a frequency of about 50 kHz to about 13.6 MHz. In another implementation, the RF power source 140 may provide between about 500 Watts and about 1,800 Watts at a frequency of about 50 kHz to about 13.6 MHz.

The controller 110 includes a central processing unit (CPU) 112, a memory 116, and a support circuit 114 utilized to control the process sequence and regulate the gas flows from the gas panel 130. The CPU 112 may be of any form of a general-purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the substrate processing system 132 are handled through numerous signal cables collectively referred to as signal buses 118, some of which are illustrated in FIG. 1A.

Figure 1B:
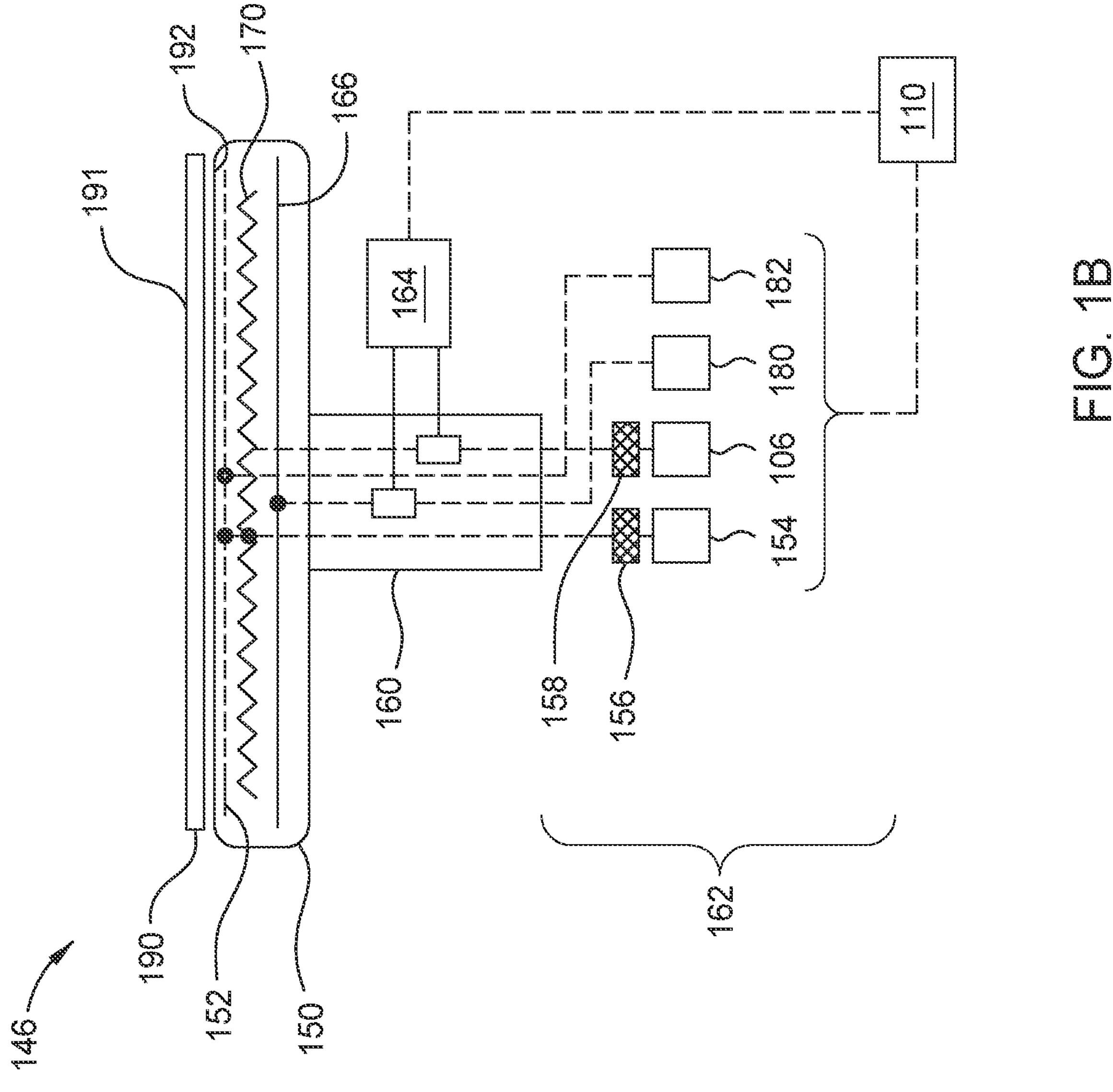
FIG. 1B shows a schematic cross-sectional view of an electrostatic chuck that may be used in the apparatus of FIG. 1A, according to certain embodiments of the present disclosure.

FIG. 1B depicts a schematic cross-sectional view of the substrate support assembly 146 used in the processing system of FIG. 1A. Referring to FIG. 1B, the electrostatic chuck 150 may include a heater element 170 suitable for controlling the temperature of a substrate 190 supported on an upper surface 192 of the electrostatic chuck 150. The heater element 170 may be embedded in the electrostatic chuck 150. The electrostatic chuck 150 may be resistively heated by applying an electric current from a heater power source 106 to the heater element 170. The heater power source 106 may be coupled through an RF filter 158. The RF filter 158 may be used to protect the heater power source 106 from RF energy. The heater element 170 may be made of a nickel-chromium wire encapsulated in a nickel-iron-chromium alloy (e.g., INCOLOY®) sheath tube. The electric current supplied from the heater power source 106 is regulated by the controller 110 to control the heat generated by the heater element 170, thus maintaining the substrate 190 and the electrostatic chuck 150 at a substantially constant temperature during film deposition. The supplied electric current may be adjusted to selectively control the temperature of the electrostatic chuck 150 between about −50 degrees Celsius to about 600 degrees Celsius.

Referring to FIG. 1A, a temperature sensor 172, such as a thermocouple, may be embedded in the electrostatic chuck 150 to monitor the temperature of the electrostatic chuck 150 in a conventional manner. The measured temperature is used by the controller 110 to control the power supplied to the heater element 170 to maintain the substrate at a desired temperature.

The electrostatic chuck 150 includes a chucking electrode 152, which may be a mesh of a conductive material. The chucking electrode 152 may be embedded in the electrostatic chuck 150. The chucking electrode 152 is coupled to a chucking power source 154 that, when energized, electrostatically clamps the substrate 190 to the upper surface 192 of the electrostatic chuck 150.

The chucking electrode 152 may be configured as a monopolar or bipolar electrode, or have another suitable arrangement. The chucking electrode 152 may be coupled through an RF filter 156 to the chucking power source 154, which provides direct current (DC) power to electrostatically secure the substrate 190 to the upper surface 192 of the electrostatic chuck 150. The RF filter 156 prevents RF power utilized to form plasma within the process chamber 100 from damaging electrical equipment or presenting an electrical hazard outside the chamber. The electrostatic chuck 150 may be fabricated from a ceramic material, such as AlN or $Al_2O_3$. Alternately, the electrostatic chuck 150 may be fabricated from a polymer, such as polyimide, polyetheretherketone (PEEK), polyaryletherketone (PAEK), and the like.

A power application system 162 is coupled to the substrate support assembly 146. The power application system 162 may include the heater power source 106, the chucking power source 154, a first radio frequency (RF) power source 180, and a second RF power source 182. Implementations of the power application system 162 may additionally include the controller 110, and a sensor device 164 that is in communication with the controller 110 and both of the first RF power source 180 and the second RF power source 182.

The controller 110 may also be utilized to control the plasma from the processing gas by application of RF power from the first RF power source 180 and the second RF power source 182 in order to deposit a layer of material on the substrate 190.

As described above, the electrostatic chuck 150 includes the chucking electrode 152 that may function in one aspect to chuck the substrate 190 while also functioning as a first RF electrode. The electrostatic chuck 150 may also include a second RF electrode 166, and together with the chucking electrode 152, may apply RF power to tune the plasma. The first RF power source 180 may be coupled to the second RF electrode 166 while the second RF power source 182 may be coupled to the chucking electrode 152. A first matching network and a second matching network may be provided for the first RF power source 180 and the second RF power source 182, respectively. The second RF electrode 166 may be a solid metal plate of a conductive material as shown. Alternatively, the second RF electrode 166 may be a mesh of conductive material.

The first RF power source 180 and the second RF power source 182 may produce power at the same frequency or a different frequency. In some implementations, one or both of the first RF power source 180 and the second RF power source 182 may independently produce power at a frequency from about 350 KHz to about 100 MHz (e.g., 350 KHz, 2 MHz, 13.56 MHz, 27 MHz, 40 MHz, 60 MHz, or 100 MHz). In some implementations, the first RF power source 180 may produce power at a frequency of 13.56 MHz and the second RF power source 182 may produce power at a frequency of 2 MHz, or vice versa. RF power from one or both of the first RF power source 180 and second RF power source 182 may be varied in order to tune the plasma. For example, the sensor device 164 may be used to monitor the RF energy from one or both of the first RF power source 180 and the second RF power source 182. Data from the sensor device 164 may be communicated to the controller 110, and the controller 110 may be utilized to vary power applied by the first RF power source 180 and the second RF power source 182.

Other deposition chambers may also benefit from the present disclosure and the parameters listed above may vary according to the particular deposition chamber used to form the amorphous carbon layer. For example, other deposition chambers may have a larger or smaller volume, requiring gas flow rates that are larger or smaller than the gas flow rates recited for deposition chambers available from Applied Materials, Inc.

Figure 2:
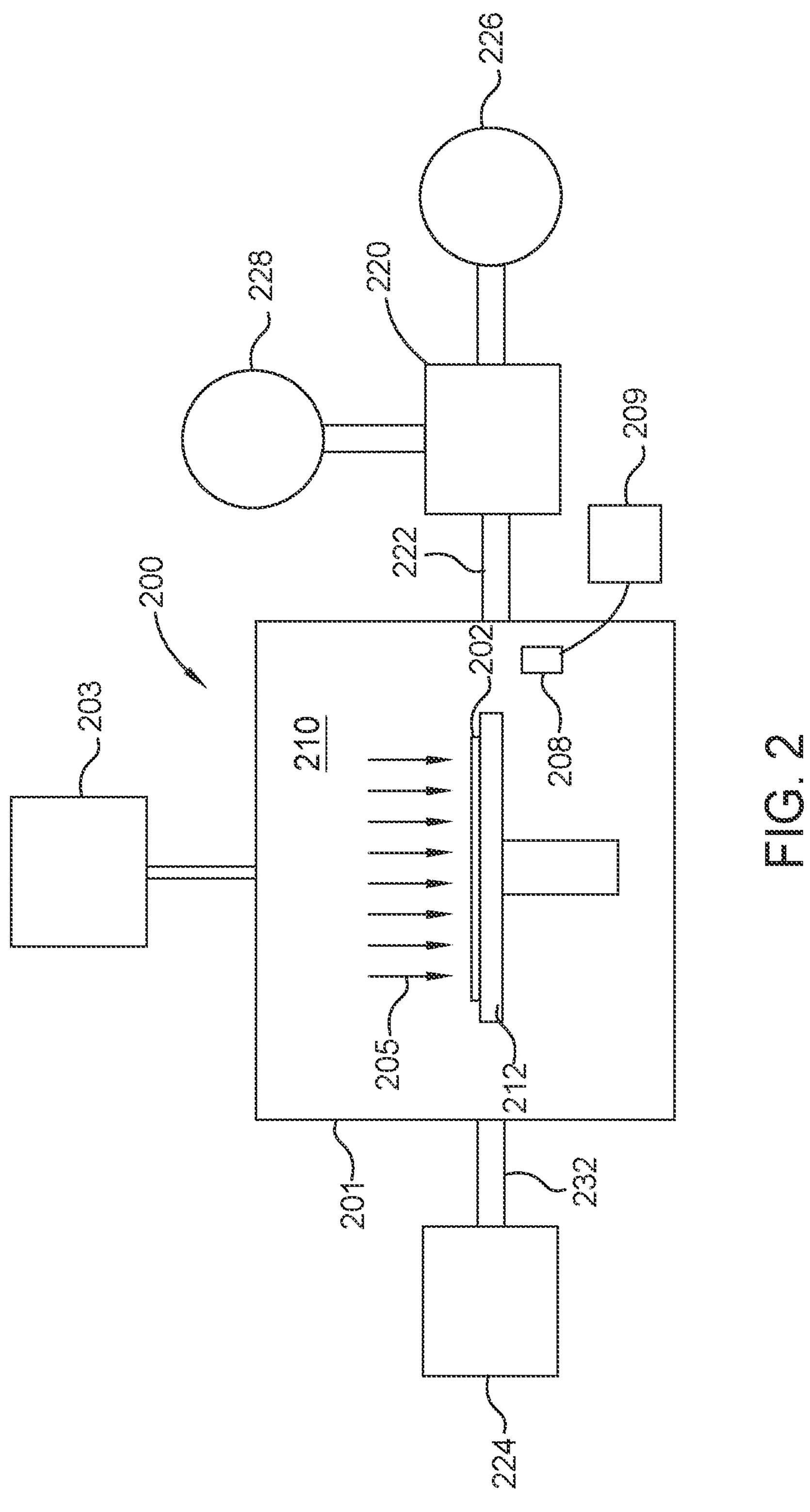
FIG. 2 shows a schematic illustration of another example process chamber that can be used for the practice of the method depicted in FIG. 3, according to certain embodiments of the present disclosure.

FIG. 2 depicts a process chamber 200, such as a rapid thermal processing (RTP) chamber with a remote plasma source 220 according to an embodiment. The RTP chamber employs heating from radiant heat, such as from a heat incandescent lamp, or from radiant energy, such as from a laser annealing system.

The process chamber 200 includes a chamber body 201 defining a process volume 210 in which a substrate 202 may be thermally processed. The substrate 202 is positioned on a substrate support 212, such as on pins or on an edge ring of low mass for fast temperature ramping. An energy source 203 is configured to direct radiant energy 205 towards the process volume 210. A sensor 208 is disposed in position to measure an attribute of components in the interior chamber body 201. The sensor 208 is configured to measure temperature of the substrate 202 by obtaining and measuring radiant energy from the substrate 202. The sensor 208 may be connected to a system controller 209, which may be used to adjust the energy source 203 according to the measurement from the sensor 208.

Connected with the processing chamber 200 is a remote plasma source (RPS) 220. The RPS 220 employed herein are any suitable RPS capable of forming a remote plasma with at least oxygen. The RPS 220 is fluidly coupled to the processing chamber 200 through a first tubing 222. An oxygen gas source 226 is also fluidly coupled to the RPS 220, such as microwave, capacitive source, or an inductively coupled remote plasma source. Further embodiments can include an inert gas source 228 coupled with the RPS 220 so as to create an oxygen/inert gas plasma which can be delivered to the process volume 210 of the processing chamber 200.

A hydrogen gas source 224 is coupled to the processing chamber 200. The hydrogen gas source 224 delivers hydrogen gas to the process volume 210 via second tubing 232, where the hydrogen gas will be activated by the oxygen plasma delivered from the RPS 220.

Temperature control facilitates the formation of quality silicon oxide. As such, the process chamber 200 and/or components such as the substrate support 212, used in embodiments described herein are controllable to temperatures between about 500° C. to about 1100° C. with fast heating and cooling of the substrate 202 in the process chamber 200.

Figure 3:
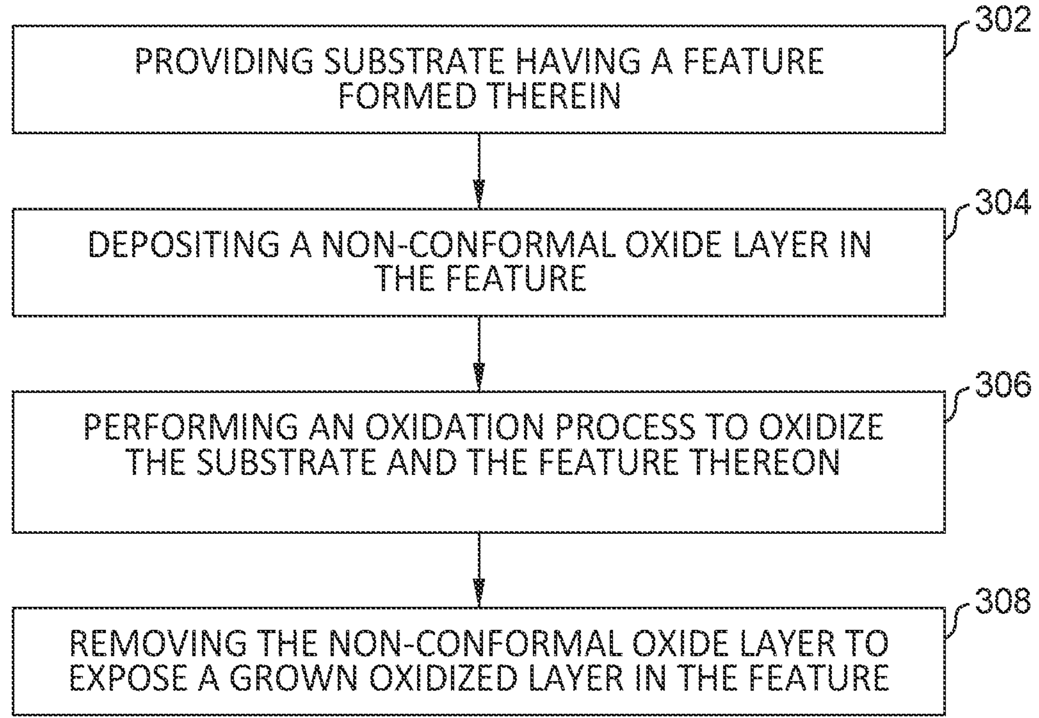
FIG. 3 is a process flow diagram of a method of forming an oxide layer in a semiconductor structure, according to certain embodiments of the present disclosure.

FIG. 3 depicts a flow diagram of a method 300 for forming an oxide layer on a substrate, according to certain embodiments. The processing method 300 described in FIG. 3 corresponds to the fabrication stages depicted in FIGS. 4A-4D, which are discussed below. FIGS. 4A-4D depict cross-sectional views of a workpiece 400 having a substrate 402 with a device structure 408 formed thereon during different stages of forming an oxide layer within a feature of the device structure 408 illustrated in method 300.

Figure 4A:
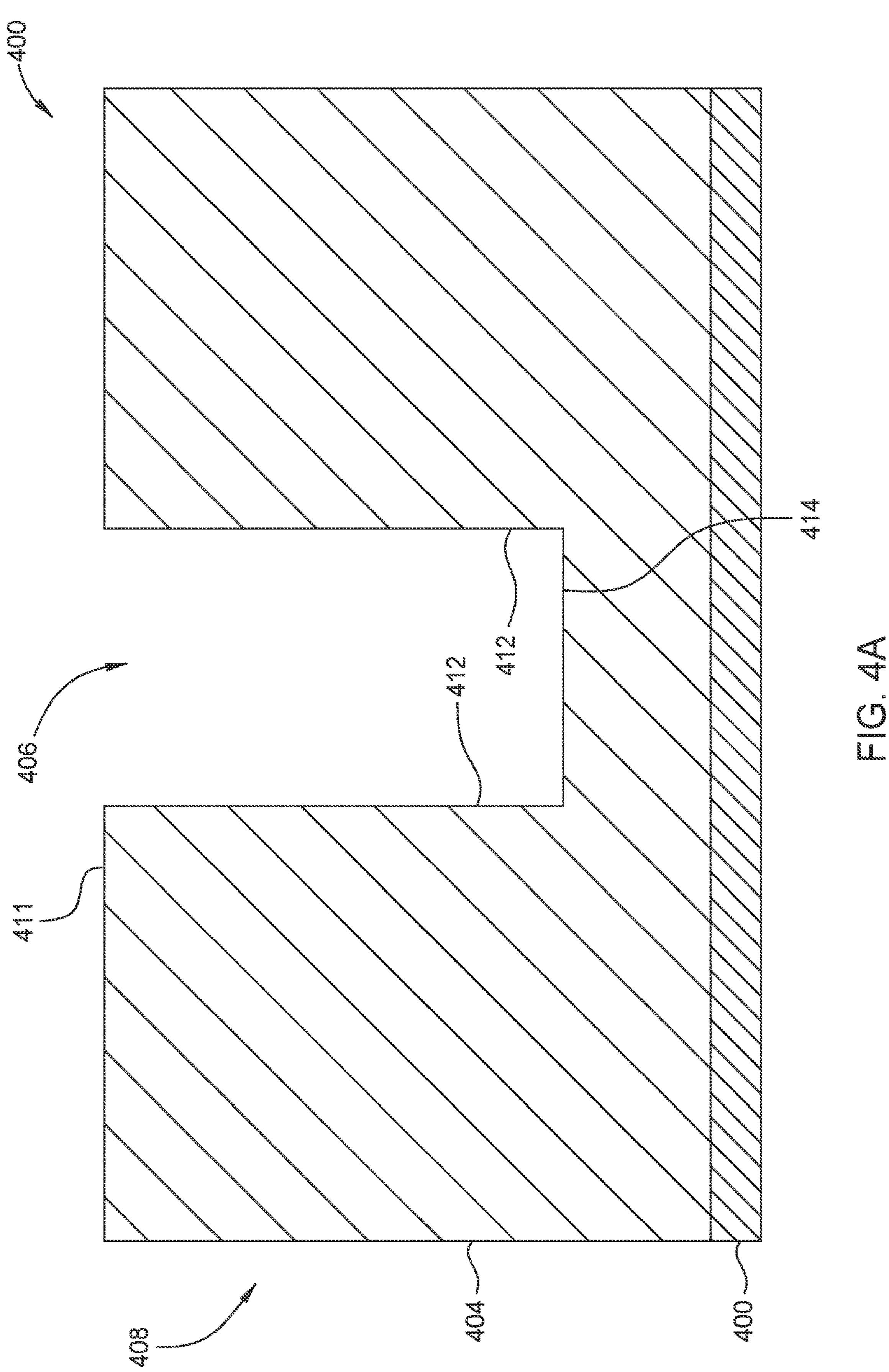
FIGS. 4A-4D show cross-sectional views of an oxide layer being formed by the method of FIG. 3, according to certain embodiments of the present disclosure.

The method 300 starts at operation 302 by providing a workpiece having a substrate with a feature formed therein, such as a workpiece 400 having the substrate 402 with a feature 406 formed therein as depicted in FIG. 4A. The workpiece 400 is positioned in a deposition process chamber, such as process chamber 100 shown in FIG. 1. The feature 406 may include high aspect ratio features such as pillars, memory holes, vias, trenches, lines, contact holes, and the like. The workpiece 400, shown in FIG. 4A, includes the substrate 402 having the device structure 408 formed on the substrate 402. It is noted the device structure 408 may be used in three-dimensional (3D) flash memory applications, 3D NAND, DRAM applications, or other suitable applications with high aspect ratio or other odd geometries.

The workpiece 400 includes a silicon containing layer 404 formed on the substrate 402. The layer 404 includes a feature 406 formed therein with high aspect ratios, such as aspect ratios greater than 1:1, for example about greater than 10:1, such as about greater than 20:1. The feature 406 may be formed in the device structure 408 with a sidewall 412 on opposite sides of a bottom surface 414. The feature 406 may form an open channel and expose the underlying layer 404. In certain embodiments, the silicon containing layer 404 may be a single silicon or silicon containing layer, such as a microcrystalline silicon layer, a monocrystalline silicon layer, a doped polysilicon layer, a doped microcrystalline silicon layer, a doped monocrystalline silicon layer, or a silicon nitride layer. In certain embodiments, the silicon containing layer 404 is a silicon (Si) layer on a silicon nitride (SiN) layer.

Figure 4B:
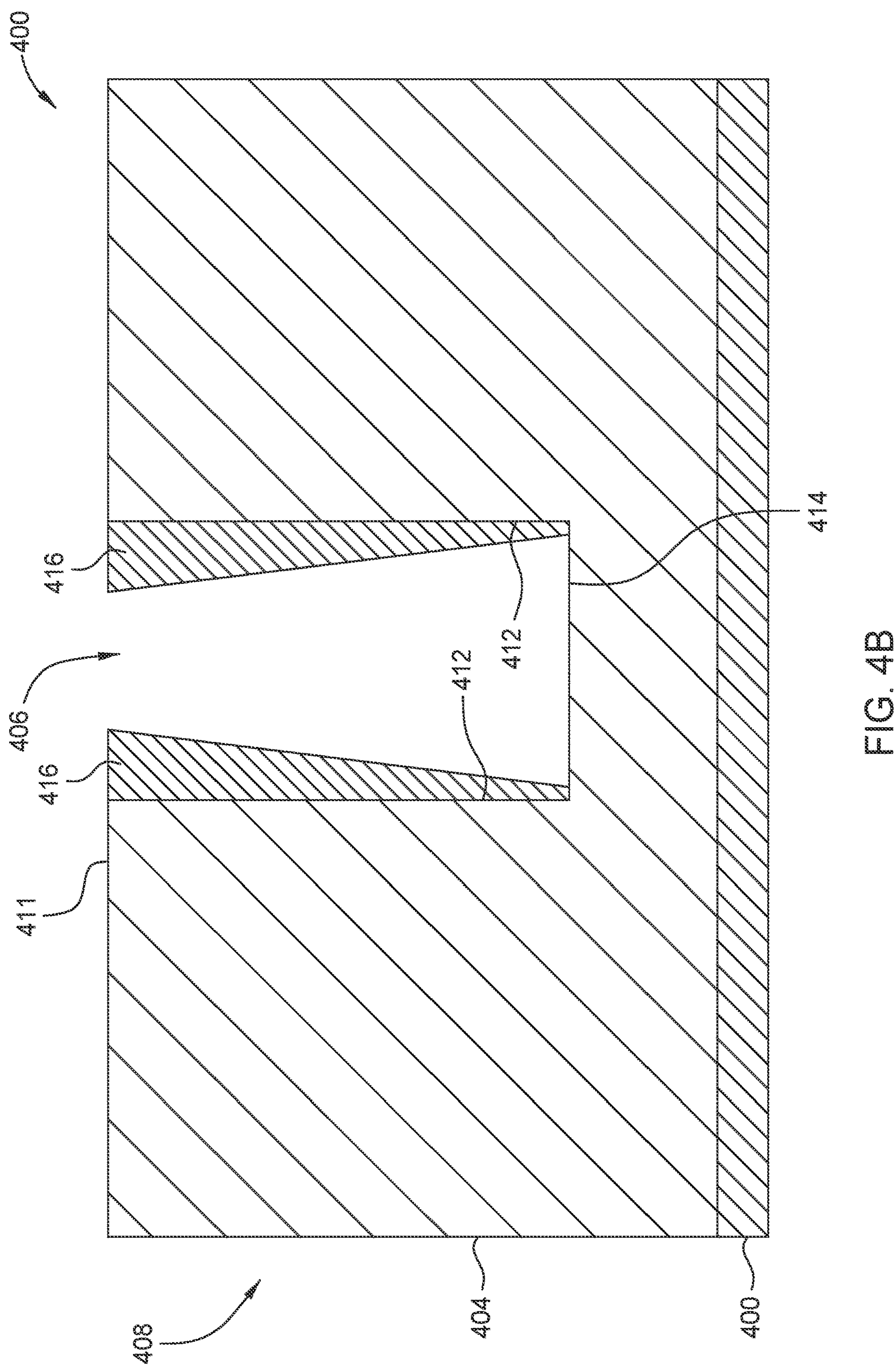

At operation 304, after transferring the workpiece 400 into process chamber, a deposition process is performed to deposit non-conformal oxide layers 416 on the sidewalls 412 of the feature 406 as shown in FIG. 4B. The non-conformal oxide layers 416 may generally retard the oxidation rate of portions of the layer 404 in contact with the non-conformal oxide layers 416. However, as further discussed below, depending on the thickness of the non-conformal oxide layer 416 formed, it was observed that the non-conformal oxide layer 416 may also increase the oxidation rate of portions of the sidewalls 412 in contact with the non-conformal oxide layers 416. The non-conformal oxide layers 416 may be deposited in the feature 406 using any suitable tunable deposition processes and/or apparatus. For example, physical vapor deposition (PVD), atomic layer deposition (ALD), plasma enhanced ALD (PEALD), chemical vapor deposition (CVD) or plasma enhanced chemical vapor deposition (PECVD) process may be used to deposit the non-conformal oxide layers 416. Alternatively or additionally, a stand-alone apparatus or a cluster tool can be used to perform a selective atomic layer deposition (ALD) process. Exemplary apparatus that can be configured for performing the above process include, for example, the OLYMPIA line of ALD apparatus, available from Applied Materials, Inc.

In certain embodiments, the non-conformal oxide layer 416 may comprise a material that is selectively removable as compared to thermal oxidized silicon ($SiO_2$) or thermal oxidized silicon nitride ($Si_2N_2O_2$). In certain embodiments, the non-conformal oxide layer 416 may comprise an aluminum oxide ($Al_2O_3$) layer. Portions of the non-conformal oxide layer 416 may have varying thickness within a range between about 0 Å to about 200 Å, such as between about 0 Å and about 100 Å, between about 100 Å and about 200 Å, between about 50 Å and about 150 Å, between about 10 Å and about 80 Å, and between about 20 Å and about 50 Å. As shown in FIG. 4B, the non-conformal oxide layers 416 may be deposited thicker on the sidewalls 412 near the substrate surface 411 and thinner near the bottom surface 414 of the feature 406. In certain embodiments, portions of the non-conformal oxide layer 416 on the sidewalls 412 near the substrate surface 411 may be formed having a thickness between about 30 Å and about 200 Å, such as between about 40 Å and about 150 Å, such as between about 50 Å and about 200 Å. In certain embodiments, portions of the non-conformal oxide layer 416 on the sidewall 412 near the bottom surface 414 may be formed having a thickness between about 0 Å and about 50 Å, such as between about 10 Å and about 30 Å, such as between about 15 Å and about 20 Å. In one embodiment, the non-conformal oxide layer 416 is a non-conformal aluminum oxide layer deposited on the sidewalls 412 by ALD and having an increasing thickness from about 20 Å near the bottom surface 414 to about 50 Å near the substrate surface 411.

The deposition of the non-conformal oxide layer 416 on the sidewalls 412 as described above enables the subsequent growth of a bottom thick oxide layer on the sidewalls 412 in the feature 406 by retarding and slowing down the oxidant consumption and oxidation rate on portions of the sidewalls 412 near the substrate surface 411.

Figure 4C:
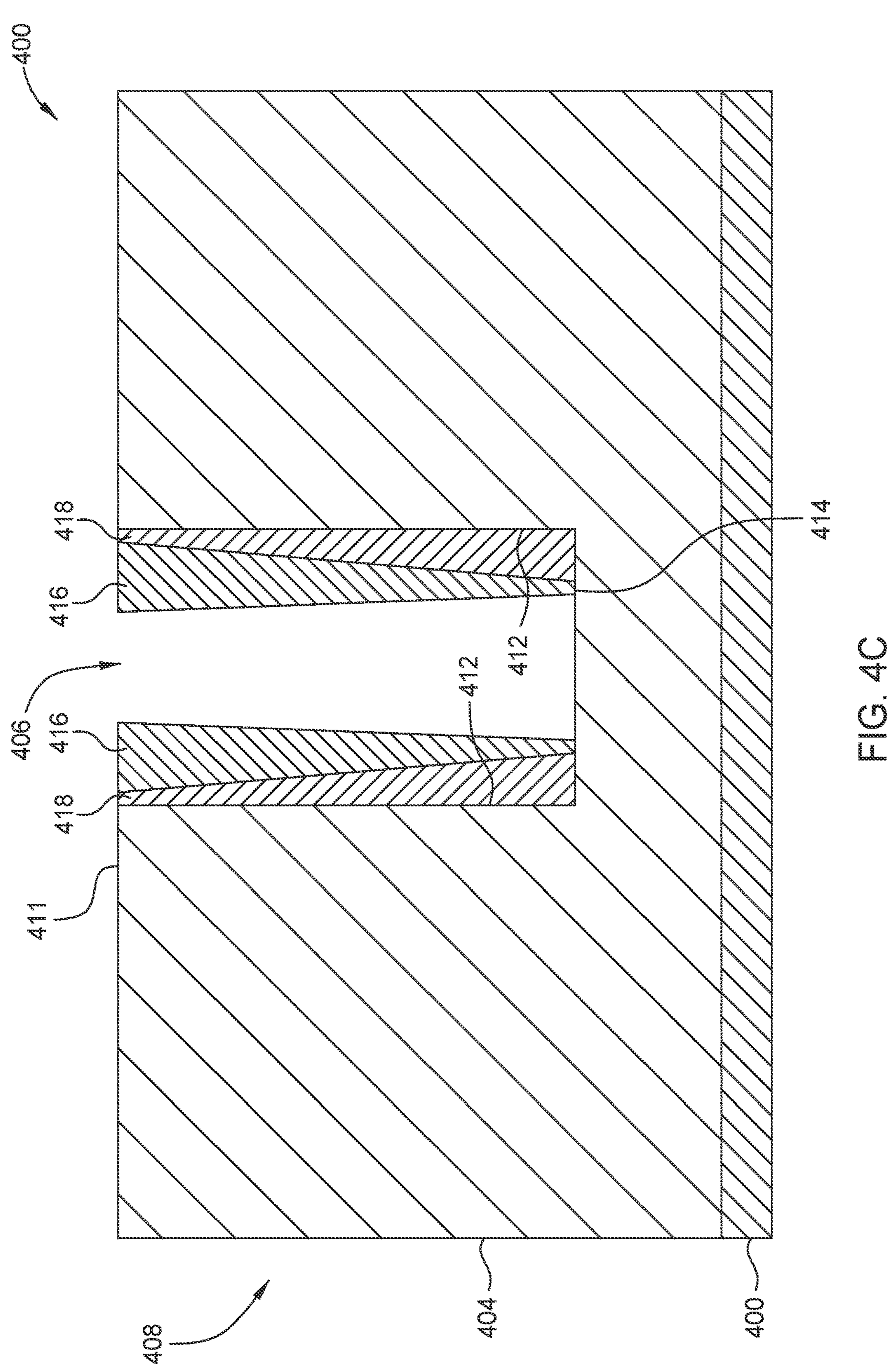
Figure 4D:
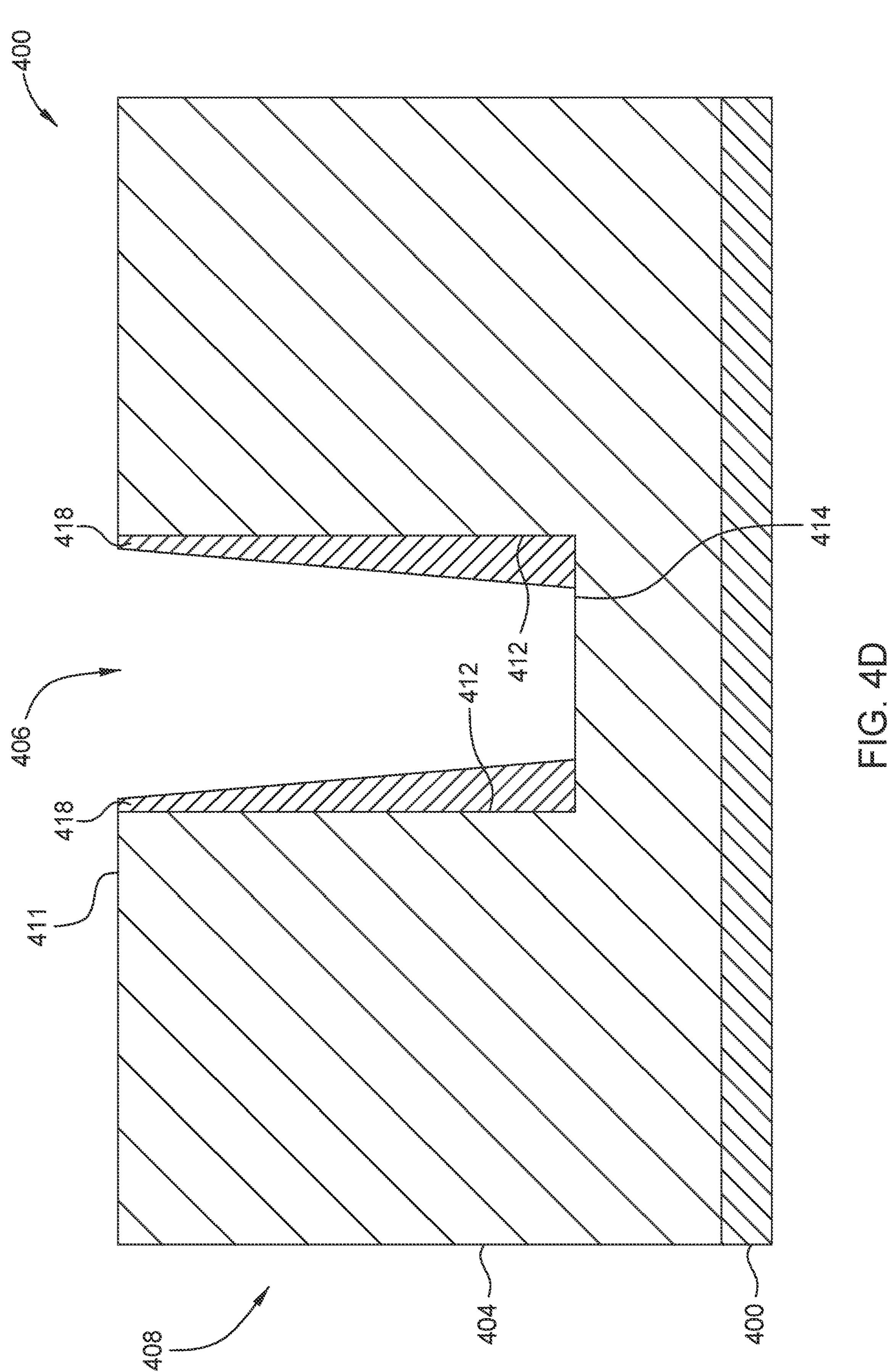

Next, at operation 306, workpiece 400 may be transferred to a process chamber, such as process chamber 200 shown in FIG. 2, and an oxidation process may be performed to oxidize the substrate 402 including the sidewalls 412 of the feature 406 to form an oxide layer 418 as shown in FIG. 4C. The oxidation layer 418 may be grown by performing an oxidation process by supplying an oxygen containing gas or oxygen plasma to the feature 406 so as to enable oxidants to diffuse through the formed oxide layer 416 and react with the sidewalls 412 to form the oxide layer 418. Due to the non-conformal oxide layer 416 deposited on the sidewalls 412, portions of the sidewalls 412 may be oxidized at different rates such that the oxide layer 418 is grown with varying thickness, such as being bottom thick near the bottom surface 414. In certain embodiments, portions of the oxide layer 418 formed may have varying thicknesses within a range between about 40 Å and about 150 Å, such as between about 40 Å and about 100 Å, between about 100 Å and about 150 Å, between about 50 Å and about 80 Å, and between about 80 Å and about 120 Å. In one embodiment, the oxide layer 418 on the sidewalls 412 is formed bottom thick with a decreasing thickness from about 100 Å near the bottom surface 414 to about 40 Å near the substrate surface 411.

In certain embodiments, the oxidation process may be a thermal oxidation process, radical plasma oxidation process, plasma oxidation process, surface oxidization process, or any suitable oxidation processes. In one embodiment, the oxidation process is a thermal oxidation process performed with a processing temperature between about 500 degrees Celsius and about at 1000 degrees Celsius, such as between about 700 degrees Celsius and about 900 degrees Celsius, such as about 800 degrees Celsius. In certain embodiments, the oxidation process is a thermal oxidation process performed between about 3 minutes and about 120 minutes, such as between about 3 minutes and about 60 minutes, such as between about 50 minutes and about 100 minutes, such as between about 5 minutes and about 20 minutes. In one embodiment, the oxidation process is a thermal oxidation process performed for about 4 minutes.

In certain embodiments, the oxidation process may be performed in any suitable chamber configured for radical oxidation, also known as in-situ steam generation (ISSG), or the like. Suitable oxidation chambers may include, but are not limited to, thermal processing chambers, such as RTP process chamber 200 in FIG. 2, a small batch fast ramp thermal furnace, RADIANCE®, Plasma Immersion Ion Implantation (P3I), VANTAGE® RADOX™, VANTAGE® RADIANCE® Plus, CENTURA®, and RADOX™ chambers available from Applied Materials, Inc. of Santa Clara, Calif. Exemplary surface oxidation process, or called radical plasma oxidation process, may be performed with various oxidative chemistries include varying reducing gas concentration for reducing gases, such as one or more of hydrogen (H2), ammonia (NH3) or the like within an oxidative gas mixture include oxidative gases, such as one or more of oxygen (O2), nitric oxide (NO), nitrous oxide (N2O) or the like, and optionally including nonreactive gases, such as one or more of nitrogen gas (N2), helium (He), argon (Ar), neon (Ne), and xenon (Xe).

At operation 308, after the oxide layer 418 is formed, a stripping process is performed to selectively remove the non-conformal oxide layer 416 and expose the grown oxide layer 418 beneath. In certain embodiments, the non-conformal oxide layer 416 may be selectively removed by a wet etch process using an etch solution, such as sulfuric acid, acetic acid, phosphoric acid, nitric acid, piranha solution, piranha solution, combinations thereof, or any suitable chemical etch solution capable of selectively removing the non-conformal oxide layer 416 with minimal or no impact to the thermal oxide in oxide layer 418.

Example

A study was performed in which two recipes were used to grow silicon oxide layers on silicon substrates. A first recipe grew a 50 Å silicon oxide layer on a bare silicon substrates. A second recipe grew an 80 Å silicon oxide layer on a bare silicon substrate. The recipes each include performing a thermal oxidation at about 800 degrees Celsius for about four (4) minutes. The same recipes were then used to separately grow silicon oxide layers on the silicon substrates when a 20 Å aluminum oxide layer was deposited on each of the silicon substrate. The same recipes were also used to separately grow silicon oxide layers on the silicon substrates when a 50 Å aluminum oxide layer was deposited. The thickness of each of the grown thermal oxide layers were measured after the respective aluminum oxide layers were stripped by a wet etch process using sulfuric acid. The basic method used was: aluminum oxide deposition, thermal oxidation process at about 800 degrees Celsius for about four (4) minutes, and wet etch aluminum oxide strip using sulfuric acid to selectively remove the deposited aluminum oxide layer. The results are collected and shown in the graph in FIG. 5.

Figure 5:
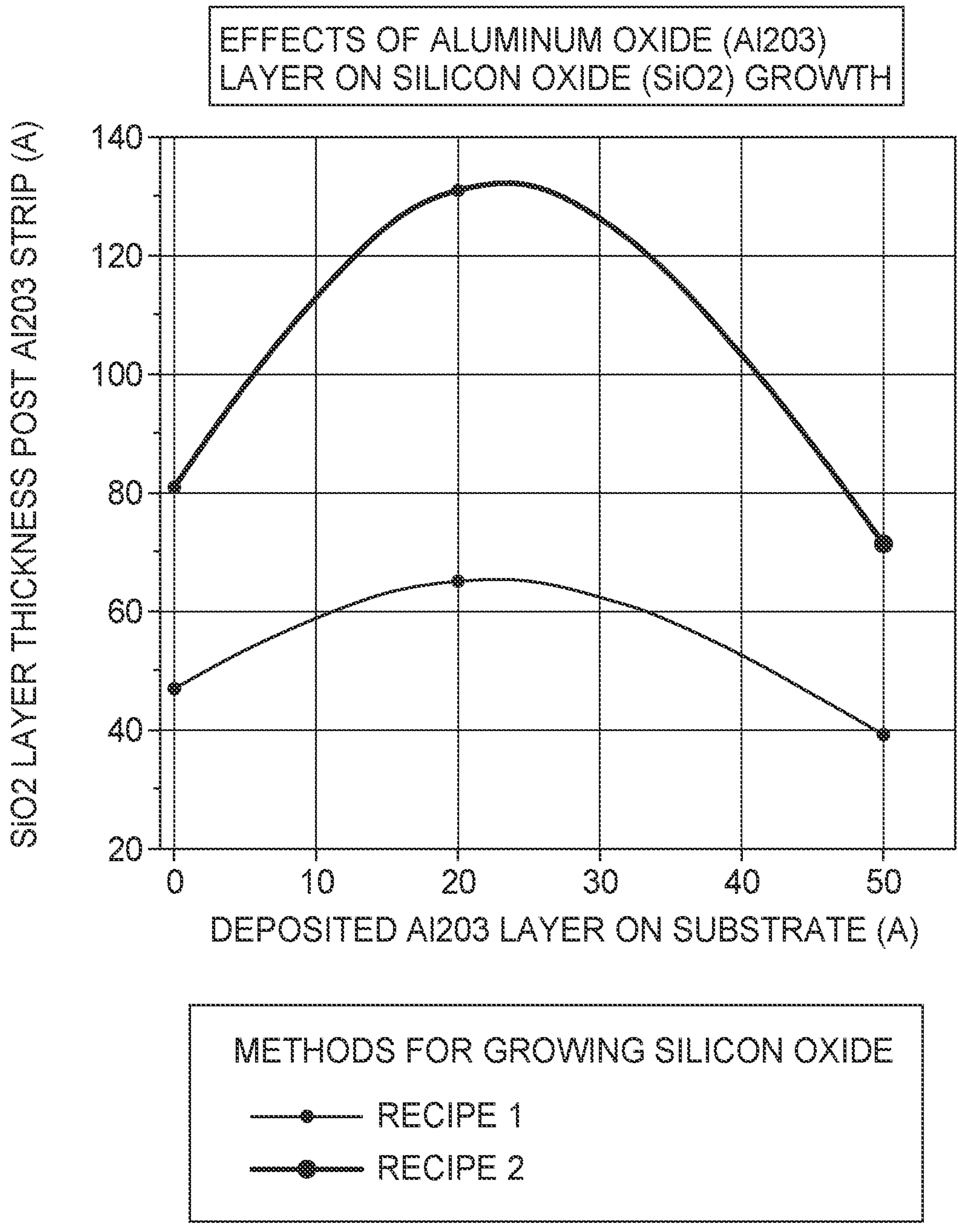
FIG. 5 is a graph showing the observed effects of deposited aluminum oxide on the thermal oxidation of silicon substrates.

FIG. 5 shows the thickness of silicon oxide growth on a silicon substrate using the two different recipes discussed above when varying thicknesses of aluminum oxide: 0 Å (bare silicon substrate), 20 Å and 50 Å, were deposited on the substrate. The two curves show the measured thickness of the thermally grown silicon oxide layer for each of the two recipes used. For the recipe used to grow a 50 Å silicon oxide layer on a bare silicon substrate, about a 65 Å silicon oxide layer was grown when 20 Å of aluminum oxide was deposited on the silicon substrate and about a 40 Å silicon oxide layer was grown when 50 Å of aluminum oxide was deposited. For the recipe used to grow an 80 Å silicon oxide layer on a bare silicon substrate, about a 130 Å silicon oxide layer was grown when a 20 Å of aluminum oxide was deposited on the silicon substrate and about a 70 Å silicon oxide layer was grown when a 50 Å of aluminum oxide was deposited. In both instances, ellipsometer measurements of the silicon oxide layer grown after the respective aluminum oxide layers were stripped indicated a thinner silicon oxide layer was thermally grown when a 50 Å of aluminum oxide was deposited on the substrate as compared to when 0 Å and 20 Å of aluminum oxide was deposited.

Not to be bound by theory, but a catalytic effect in thermal oxidation of the silicon substrate was observed when a 20 Å layer of aluminum oxide was deposited on the silicon substrate as compared to when 0 Å was deposited (bare silicon substrate). As shown in FIG. 5, a 70 Å and 130 Å silicon oxide layer was grown when 20 Å of aluminum oxide was deposited in both recipes, which are both thicker than the 50 Å and 80 Å silicon oxide layers grown on bare silicon substrates, respectively.

As such, in addition to depositing a relatively thick oxide layer 416 to retard oxidation on portions of the sidewalls 412 near the substrate surface 411, depositing a thin oxide layer 416 near the bottom surface 414 of the feature 406 appears to increase the thickness of the oxide layer near the bottom surface 414 than would have otherwise been grown if oxide layer 418 was only deposited on portions of the sidewalls 412 near the substrate surface 411.

Figure 6:
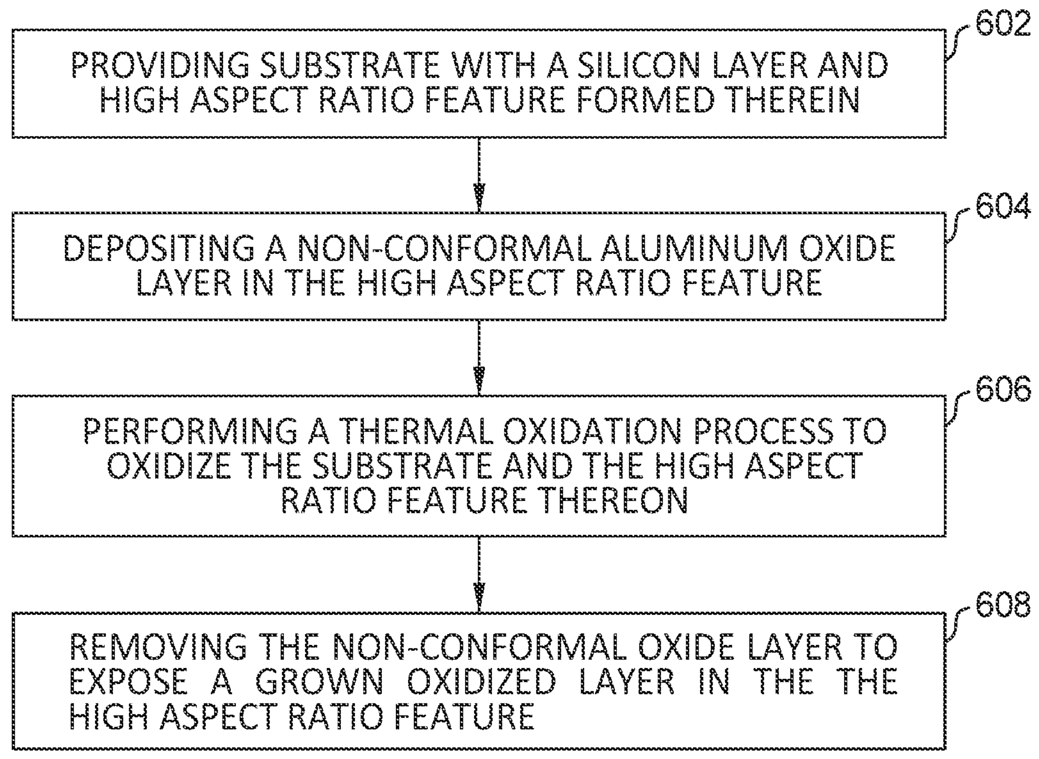
FIG. 6 shows another process flow diagram of a method of forming a silicon oxide layer in a semiconductor structure, according to certain embodiments of the present disclosure.

FIG. 6 depicts another flow diagram of a method 600 for growing a bottom thick oxide layer in a feature on a substrate, according to certain embodiments. Method 600 provides for growing a bottom thick silicon oxide layer in a high aspect ratio feature.

At operation 602, a substrate having a single silicon layer and a high aspect ratio feature formed thereon may be disposed in a deposition process chamber, such as process chamber 100 shown in FIG. 1. At operation 604, a non-conformal ALD deposition process is performed to deposit a non-conformal aluminum oxide layer on each of the sidewalls of the feature on the substrate. In certain embodiments, the non-conformal aluminum oxide layer deposited on the sidewalls may have an increasing thickness from about 20 Å near a bottom surface of the feature to about 50 Å near the opening of the feature and substrate surface.

At operation 606, the substrate may be transferred to a thermal process chamber, such as RTP process chamber 200 in FIG. 2, and a thermal oxidation process may be performed to oxidize the substrate and the feature formed thereon. The silicon oxide layer is formed when oxygen plasma in the feature diffuses through the aluminum oxide layer and reacts with the silicon in the sidewalls in the presence of heat. The thermal oxidation process may be performed at about 800 degrees Celsius for about 4 minutes. The oxidation process may therefor form a bottom thick silicon oxide layer beneath the aluminum oxide layer deposited on the sidewalls in the feature. In one embodiment, the bottom thick silicon oxide layer grown on the sidewalls has a decreasing thickness from about 100 Å near the bottom surface of the feature to about 40 Å at the top near the opening and substrate surface.

At operation 608, after the bottom thick silicon oxide layer is grown on the sidewalls in the feature, a wet etch process is performed to selectively remove the aluminum oxide layer and expose the thermally grown silicon oxide layer. The wet etch process may include exposing the aluminum oxide layer in the feature to an etch solution, such as sulfuric acid, to remove the aluminum oxide layer with minimal or no impact to the thermally grown silicon oxide layer underneath.

Figure 7:
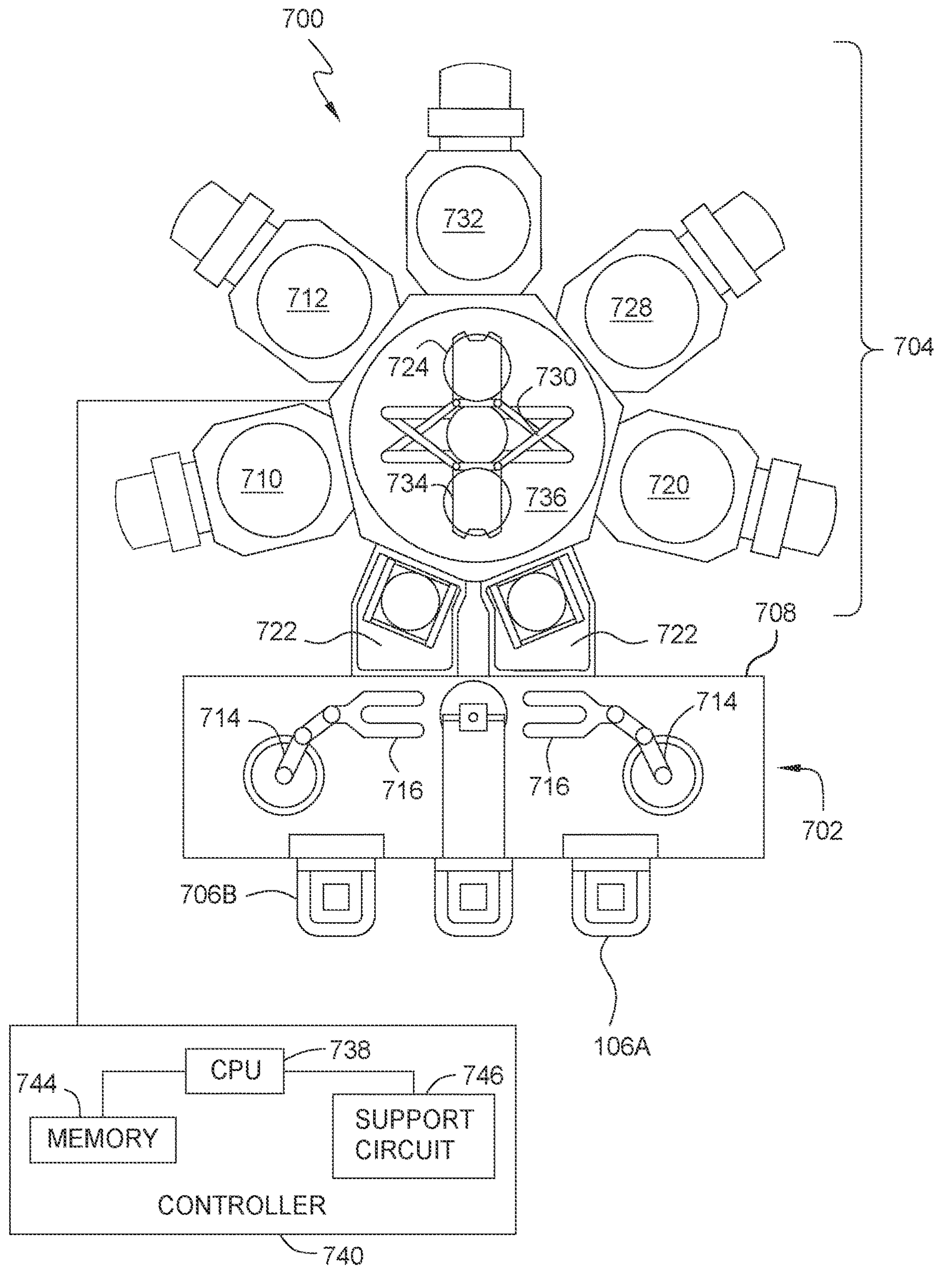
FIG. 7 shows a schematic top view of a multi-chamber processing system that may be used to perform the methods described in FIG. 3, according to certain embodiments of the present disclosure.

FIG. 7 is a schematic top view diagram of the multi-chamber processing system 700 that can be adapted to perform a metal layer deposition process as disclosed herein. The system 700 can include one or more load lock chambers 702 and 704 for transferring workpiece 400 into and out of the system 700. Generally, the system 700 is maintained under vacuum and the load lock chambers 702 and 704 can be "pumped down" to introduce workpiece 400 introduced into the system 700. A first robot 710 can transfer the workpiece 400 between the load lock chambers 702 and 704, and a first set of one or more substrate processing chambers 712, 714, 716, and 718. Each processing chamber 712, 714, 716, and 718 is configured to be at least one of a substrate deposition process, such as cyclical layer deposition (CLD), atomic layer deposition (ALD), chemical vapor deposition (CVD), physical vapor deposition (PVD), etch, degas, pre-cleaning orientation, anneal, and other substrate processes. The position of the processing chamber 718 utilized to perform an atomic layer deposition (ALD) process relative to the other processing chambers 712, 714, 716 is for illustration, and the position of the processing chamber 718 may be optionally be switched with any one of the processing chambers 712, 714, 716 if desired.

The first robot 710 can also transfer workpiece 400 to/from one or more transfer chambers 722 and 724. The transfer chambers 722 and 724 can be used to maintain ultrahigh vacuum conditions while allowing workpiece 400 to be transferred within the system 700. A second robot 730 can transfer the workpiece 400 between the transfer chambers 722 and 724 and a second set of one or more processing chambers 732, 734, 736 and 738. Similar to the processing chambers 712, 714, 716, and 718, the processing chambers 732, 734, 736, and 738 can be outfitted to perform a variety of substrate processing operations including the ALD and thermal oxidation processes, for example. Any of the substrate processing chambers 712, 714, 716, 732, 734, 736, and 738 can be removed from the system 700 if not necessary for a particular process to be performed by the system 700. After the aluminum oxide deposition process is performed in the processing chamber 718, the workpiece 400 may further be transferred to any of the processing chambers 712, 714, 716, 732, 734, 736, and 738 of the system 700 to perform other process as needed.

The microprocessor controller 740 controls the operation of the system 700 using a direct control of the processing chambers 712, 714, 716, 718, 732, 734, 736, and 738 or alternatively, by controlling the computers (or controllers) associated with the processing chambers 712, 714, 716, 718, 732, 734, 736, and 738 and the system 700. In operation, the microprocessor controller 740 enables data collection and feedback from the respective chambers and systems to optimize performance of the system 700. The microprocessor controller 740 generally includes a Central Processing Unit (CPU) 738, a memory 744, and a support circuit 746. The CPU 738 may be one of any form of a general-purpose computer processor that can be used in an industrial setting. The support circuit 746 is conventionally coupled to the CPU 738 and may comprise a cache, clock circuits, input/output subsystems, power supplies, and the like. Software routines, such as a method as described above may be stored in the memory 742 and, when executed by the CPU 738, transform the CPU 738 into a specific purpose computer (microprocessor controller) 740. The software routines may also be stored and/or executed by a second controller (not shown) that is located remotely from the system 700.

What is claimed is:

1. A method for forming an oxide layer, suitable for use in semiconductor manufacturing, the method comprising:

forming a non-conformal oxide layer on a substrate; and then performing an oxidation process to oxidize the substrate and grow a thermal oxide layer underneath the non-conformal oxide layer; and selectively removing the non-conformal oxide layer to expose an oxidized portion of the substrate.

2. The method of claim 1, wherein the substrate comprises a silicon or a silicon nitride layer, and the silicon or silicon nitride layer includes a high aspect ratio feature having a pair of sidewalls defining an opening opposite of a bottom surface, and wherein the high aspect ratio feature has an aspect ratio of greater than 1:1.

3. The method of claim 2, wherein the non-conformal oxide layer is formed on the sidewalls of the high aspect ratio feature with a decreasing thickness between the opening and the bottom surface, wherein one or more portions of the non-conformal oxide layer near the opening is thicker than one or more portions of the non-conformal oxide layer near the bottom surface.

4. The method of claim 2, wherein the non-conformal oxide layer comprises aluminum oxide formed with varying thicknesses between about 20 Å and about 50 Å, between the opening and the bottom surface.

5. The method of claim 2, wherein forming the non-conformal oxide layer comprises exposing the substrate to one or more precursor gases in an atomic layer deposition (ALD) process, and wherein the aspect ratio is about 10:1 to about 20:1.

6. The method of claim 1, wherein selectively removing the oxide layer comprises performing a wet etch process using an etch solution capable of selectively removing the non-conformal oxide layer with minimal or no impact to the thermal oxide layer underneath the non-conformal oxide layer.

7. The method of claim 6, wherein the etch solution comprises sulfuric acid, acetic acid, phosphoric acid, nitric acid, piranha solution, or combinations thereof.

8. A method for forming an oxide layer, suitable for use in semiconductor manufacturing, the method comprising:

forming a non-conformal aluminum oxide layer on a substrate; and then performing an oxidation process to oxide the substrate and grow a thermal oxide layer underneath the non-conformal aluminum oxide layer; and selectively removing the non-conformal aluminum oxide layer to expose an oxidized portion of the substrate.

9. The method of claim 8, wherein the substrate comprises a silicon or a silicon nitride layer, and the silicon or silicon nitride layer includes a high aspect ratio feature having a pair of sidewalls defining an opening opposite of a bottom surface, and wherein the high aspect ratio feature has an aspect ratio of greater than 1:1.

10. The method of claim 9, wherein the non-conformal aluminum oxide layer is formed on the sidewalls of the high aspect ratio feature with a decreasing thickness between the opening and the bottom surface, wherein one or more portions of the non-conformal aluminum oxide layer near the opening is thicker than one or more portions of the non-conformal aluminum oxide layer near the bottom surface.

11. The method of claim 10, wherein the non-conformal aluminum oxide layer comprises varying thicknesses between about 20 Å and about 50 Å, between the opening and the bottom surface.

12. The method of claim 9, wherein forming the non-conformal aluminum oxide layer comprises exposing the substrate to one or more precursor gases in an atomic layer deposition (ALD) process, and wherein the aspect ratio is about 10:1 to about 20:1.

13. The method of claim 8, wherein selectively removing the oxide layer comprises performing a wet etch process using an etch solution capable of selectively removing the non-conformal aluminum oxide layer with minimal or no impact to the thermal oxide layer underneath the non-conformal aluminum oxide layer.

14. The method of claim 13, wherein the etch solution comprises sulfuric acid, acetic acid, phosphoric acid, nitric acid, piranha solution, or combinations thereof.

15. A method for forming an oxide layer, suitable for use in semiconductor manufacturing, the method comprising:

forming a non-conformal aluminum oxide layer on a silicon containing substrate using a deposition process; and then performing an oxidation process to oxidize the silicon containing substrate and grow a thermal oxide layer underneath the non-conformal aluminum oxide layer; and performing a wet etching process to selectively remove the non-conformal aluminum oxide layer and expose an oxidized portion of the silicon containing substrate.

16. The method of claim 15, wherein the silicon containing substrate comprises silicon or silicon nitride, and the silicon containing substrate includes a high aspect ratio feature having a pair of sidewalls defining an opening opposite of a bottom surface, and wherein the high aspect ratio feature has an aspect ratio of greater than 1:1.

17. The method of claim 16, wherein the non-conformal aluminum oxide layer is formed on the sidewalls of the high aspect ratio feature with a decreasing thickness between the opening and the bottom surface, wherein one or more portions of the non-conformal aluminum oxide layer near the opening is thicker than one or more portions of the non-conformal aluminum oxide layer near the bottom surface.

18. The method of claim 17, wherein the non-conformal aluminum oxide layer comprises varying thicknesses between about 20 Å and about 50 Å, between the opening and the bottom surface.

19. The method of claim 15, wherein forming the non-conformal aluminum oxide layer using the deposition process comprises exposing the substrate to one or more precursor gases in an atomic layer deposition (ALD) process, and wherein the aspect ratio is about 10:1 to about 20:1.

20. The method of claim 15, wherein selectively removing the oxide layer comprises performing a wet etch process using an etch solution comprising sulfuric acid, acetic acid, phosphoric acid, nitric acid, piranha solution, or combinations thereof.

* * * * *